United States Patent
Ju et al.

(10) Patent No.: US 12,108,564 B2
(45) Date of Patent: Oct. 1, 2024

(54) FLOW PATH MODULE, COOLANT DISTRIBUTION DEVICE, AND SERVER

(71) Applicant: Wistron Corporation, New Taipei (TW)

(72) Inventors: Yu-Tang Ju, New Taipei (TW); Ming-Chang Wu, New Taipei (TW)

(73) Assignee: Wistron Corporation, New Taipei (TW)

( * ) Notice: Subject to any disclaimer, the term of this patent is extended or adjusted under 35 U.S.C. 154(b) by 271 days.

(21) Appl. No.: 17/728,940

(22) Filed: Apr. 25, 2022

(65) Prior Publication Data

US 2023/0232580 A1    Jul. 20, 2023

(30) Foreign Application Priority Data

Jan. 19, 2022  (TW) .................................. 111102246

(51) Int. Cl.
  H05K 7/20  (2006.01)
(52) U.S. Cl.
  CPC ..... H05K 7/20272 (2013.01); H05K 7/20263 (2013.01); H05K 7/20781 (2013.01)
(58) Field of Classification Search
  CPC ........... H05K 7/20272; H05K 7/20263; H05K 7/20781
  See application file for complete search history.

(56) References Cited

U.S. PATENT DOCUMENTS

| 5,514,906 A * | 5/1996 | Love ..................... H01L 23/473 257/E23.098 |
| 9,927,187 B2 | 3/2018 | Moore et al. |
| 10,571,206 B2 | 2/2020 | Moore et al. |
| 2015/0253088 A1 | 9/2015 | Moore et al. |
| 2018/0216899 A1 | 8/2018 | Moore et al. |

FOREIGN PATENT DOCUMENTS

| TW | I334968 | 12/2010 |
| TW | I345629 | 7/2011 |
| TW | 201414411 | 4/2014 |

OTHER PUBLICATIONS

"Office Action of Taiwan Counterpart Application", issued on Oct. 6, 2022, p. 1-p. 7.

* cited by examiner

Primary Examiner — Adrian S Wilson
(74) Attorney, Agent, or Firm — JCIPRNET (57) ABSTRACT

A flow path module, adapted to a heat exchange element and a coolant and including a pipeline structure and at least one flow resistance element, is provided. The pipeline structure is adapted to be connected to the heat exchange element. The flow resistance element is disposed in the pipeline structure, and the coolant flows through the heat exchange element from the pipeline structure. A flow resistance of the flow resistance element is adapted to be adjusted corresponding to a flow resistance of the heat exchange element. A coolant distribution device and a server are also provided.

21 Claims, 7 Drawing Sheets

FLOW PATH MODULE, COOLANT DISTRIBUTION DEVICE, AND SERVER

CROSS-REFERENCE TO RELATED APPLICATION

This application claims the priority benefit of Taiwan application serial no. 111102246, filed on Jan. 19, 2022. The entirety of the above-mentioned patent application is hereby incorporated by reference herein and made a part of this specification.

BACKGROUND

Technical Field

The disclosure relates to a fluid flow path module, a fluid distribution device, and an electronic equipment, and more particularly to a flow path module with adjustable flow resistance, a coolant distribution device, and a server.

Description of Related Art

With the improvement of server performance, the heat dissipation requirements increase accordingly. For a server with a water-cooling heat dissipation design, the heat generated by a heating element of the server is transferred to a water-cooling plate, and the water-cooling plate is connected to a coolant distribution device (that is, a coolant distribution unit, CDU) through a coolant pipeline, so that a coolant may be circulated between the water-cooling plate and the coolant distribution device to continuously dissipate heat from the water-cooling plate.

The water-cooling plate has a closed pipeline structure, and the internal state cannot be known by naked eye observation or general measurement. Usually, the internal state can be known only by testing the flow resistance and the cooling capacity or by taking X-ray photographs of the internal structure, so as to examine the quality of the water-cooling plate. In order to detect the water-cooling plate without shutting down the server, the prior art generally uses a detection circuit to detect whether the water-cooling plate leaks. However, such method consumes extra power, the detection circuit needs to be matched with the design of a mainboard of the server, and whether the water-cooling plate is blocked cannot be detected.

SUMMARY

The disclosure provides a flow path module with adjustable flow resistance, a coolant distribution device, and a server, which can detect a state of a corresponding heat exchange element by monitoring the flow path module.

A flow path module with adjustable flow resistance of the disclosure is adapted to a heat exchange element and a coolant and includes a pipeline structure and at least one flow resistance element. The pipeline structure is adapted to be connected to the heat exchange element. The flow resistance element is disposed in the pipeline structure, and the coolant flows through the heat exchange element from the pipeline structure. A flow resistance of the flow resistance element is adapted to be adjusted corresponding to a flow resistance of the heat exchange element.

In an embodiment of the disclosure, the pipeline structure includes a master pipeline line set and a branch pipeline set, the at least one flow resistance element includes a first flow resistance element and a valve body, the valve body is movably disposed in the branch pipeline set, the master pipeline set is adapted to be connected to the heat exchange element, the coolant is adapted to flow through the heat exchange element through the master pipeline set, the branch pipeline set is communicated with the master pipeline set and has a monitor section, the first flow resistance element is disposed in the branch pipeline set, a flow resistance of the first flow resistance element is adjusted, so that a flux of the coolant in the monitor section is a predetermined value, and when the flow resistance of the heat exchange element changes, the flux of the coolant in the monitor section deviates from the predetermined value.

In an embodiment of the disclosure, the predetermined value is zero.

In an embodiment of the disclosure, the master pipeline set includes a first master pipeline and a second master pipeline, the first master pipeline has a first inlet end and a first outlet end, the second master pipeline has a second inlet end and a second outlet end, the first outlet end and the second inlet end are adapted to be connected to a heat exchange element, and the first inlet end and the second outlet end are adapted to be connected to another heat exchange element.

In an embodiment of the disclosure, the heat exchange element is a heat exchange element in a server, and the another heat exchange element is a heat exchange element in a coolant distribution device.

In an embodiment of the disclosure, the branch pipeline set includes a first branch pipeline and a second branch pipeline, the first branch pipeline has a first connecting end and a second connecting end, the first connecting end is connected to the first master pipeline and is located between the first inlet end and the first outlet end, the second connecting end is connected to the second master pipeline and is located between the second inlet end and the second outlet end, the second branch pipeline has a third connecting end and a fourth connecting end, the third connecting end is connected to the first master pipeline and is located between the first inlet end and the first connecting end, the fourth connecting end is connected to the first branch pipeline and is located between the first connecting end and the second connecting end, the first flow resistance element is disposed in the first branch pipeline and is located between the fourth connecting end and the second connecting end, and the monitor section is located between the first connecting end and the fourth connecting end.

In an embodiment of the disclosure, the at least flow resistance element further includes a second flow resistance element and a third flow resistance element, the second flow resistance element is disposed in the first master pipeline and is located between the first connecting end and the third connecting end, the third flow resistance element is disposed in the second branch pipeline, and the flow resistance of the first flow resistance element is adapted to be adjusted according to the flux of the coolant, a flow resistance of the second flow resistance element, and a flow resistance of the third flow resistance element, so that the flux of the coolant between the first connecting end and the fourth connecting end is the predetermined value.

In an embodiment of the disclosure, the flow path module further includes a monitor element. The monitor element is disposed in the monitor section, and the monitor element is adapted to monitor whether the flux of the coolant in the monitor section is the predetermined value.

In an embodiment of the disclosure, the monitor element includes a turbine, a flow meter, or a flux meter.

In an embodiment of the disclosure, the monitor section includes a transparent pipeline.

A coolant distribution device of the disclosure is adapted to a heat exchange element and a coolant and includes a device body and a flow path module with adjustable flow resistance. The flow path module with adjustable flow resistance includes a pipeline structure and at least one flow resistance element. The pipeline structure is adapted to be connected between the heat exchange element and the device body. The flow resistance element is disposed in the pipeline structure. The coolant flows through the heat exchange element from the pipeline structure, and a flow resistance of the flow resistance element is adapted to be adjusted corresponding to a flow resistance of the heat exchange element.

In an embodiment of the disclosure, the pipeline structure includes a master pipeline line set and a branch pipeline set, the at least one flow resistance element includes a first flow resistance element and a valve body, the valve body is movably disposed in the branch pipeline set, the master pipeline set is adapted to be connected to the heat exchange element, the coolant is adapted to flow through the heat exchange element through the master pipeline set, the branch pipeline set is communicated with the master pipeline set and has a monitor section, the first flow resistance element is disposed in the branch pipeline set, a flow resistance of the first flow resistance element is adjusted, so that a flux of the coolant in the monitor section is a predetermined value, and when the flow resistance of the heat exchange element changes, the flux of the coolant in the monitor section deviates from the predetermined value.

In an embodiment of the disclosure, the predetermined value is zero.

In an embodiment of the disclosure, the master pipeline set includes a first master pipeline and a second master pipeline, the first master pipeline has a first inlet end and a first outlet end, the second master pipeline has a second inlet end and a second outlet end, the first outlet end and the second inlet end are adapted to be connected to the heat exchange element, the coolant distribution device includes another heat exchange element, the another heat exchange element is disposed in the device body, the first inlet end and the second outlet end are adapted to be connected to the another heat exchange element.

In an embodiment of the disclosure, the branch pipeline set includes a first branch pipeline and a second branch pipeline, the first branch pipeline has a first connecting end and a second connecting end, the first connecting end is connected to the first master pipeline and is located between the first inlet end and the first outlet end, the second connecting end is connected to the second master pipeline and is located between the second inlet end and the second outlet end, the second branch pipeline has a third connecting end and a fourth connecting end, the third connecting end is connected to the first master pipeline and is located between the first inlet end and the first connecting end, the fourth connecting end is connected to the first branch pipeline and is located between the first connecting end and the second connecting end, the first flow resistance element is disposed in the first branch pipeline and is located between the fourth connecting end and the second connecting end, and the monitor section is located between the first connecting end and the fourth connecting end.

In an embodiment of the disclosure, the at least flow resistance element further includes a second flow resistance element and a third flow resistance element, the second flow resistance element is disposed in the first master pipeline and is located between the first connecting end and the third connecting end, the third flow resistance element is disposed in the second branch pipeline, the flow resistance of the first flow resistance element is adapted to be adjusted according to the flux of the coolant, a flow resistance of the second flow resistance element, and a flow resistance of the third flow resistance element, so that the flux of the coolant between the first connecting end and the fourth connecting end is the predetermined value.

In an embodiment of the disclosure, the heat exchange element is a heat exchange element in a server.

In an embodiment of the disclosure, the flow path module with adjustable flow resistance further includes a monitor element, the monitor element is disposed in the monitor section, and the monitor element is adapted to monitor whether the flux of the coolant in the monitor section is the predetermined value.

In an embodiment of the disclosure, the monitor element includes a turbine, a flow meter, or a flux meter.

In an embodiment of the disclosure, the monitor section includes a transparent pipeline.

A server of the disclosure is adapted to a coolant and includes a server body, a heat exchange element, and a flow path module with adjustable flow resistance. The heat exchange element is disposed in the server body. The flow path module with adjustable flow resistance includes a pipeline structure and at least one flow resistance element. The pipeline structure is connected to the heat exchange element. The flow resistance element is disposed in the pipeline structure. The coolant flows through the heat exchange element from the pipeline structure, and a flow resistance of the flow resistance element is adapted to be adjusted corresponding to a flow resistance of the heat exchange element.

DETAILED DESCRIPTION OF DISCLOSED EMBODIMENTS

Figure 1:
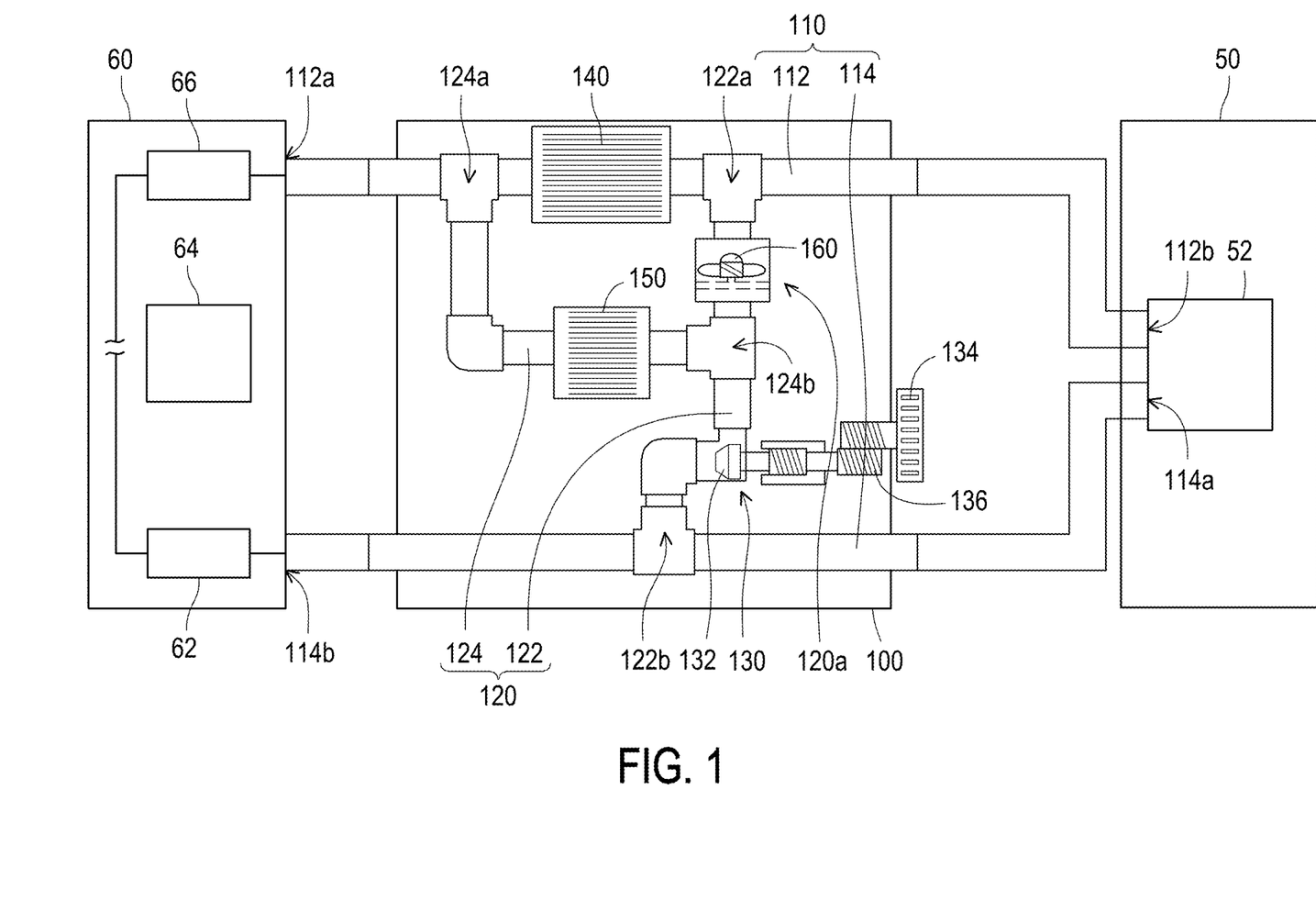
FIG. 1 is a schematic diagram of a flow path module connected between a coolant distribution device and a server according to an embodiment of the disclosure.
Figure 2:
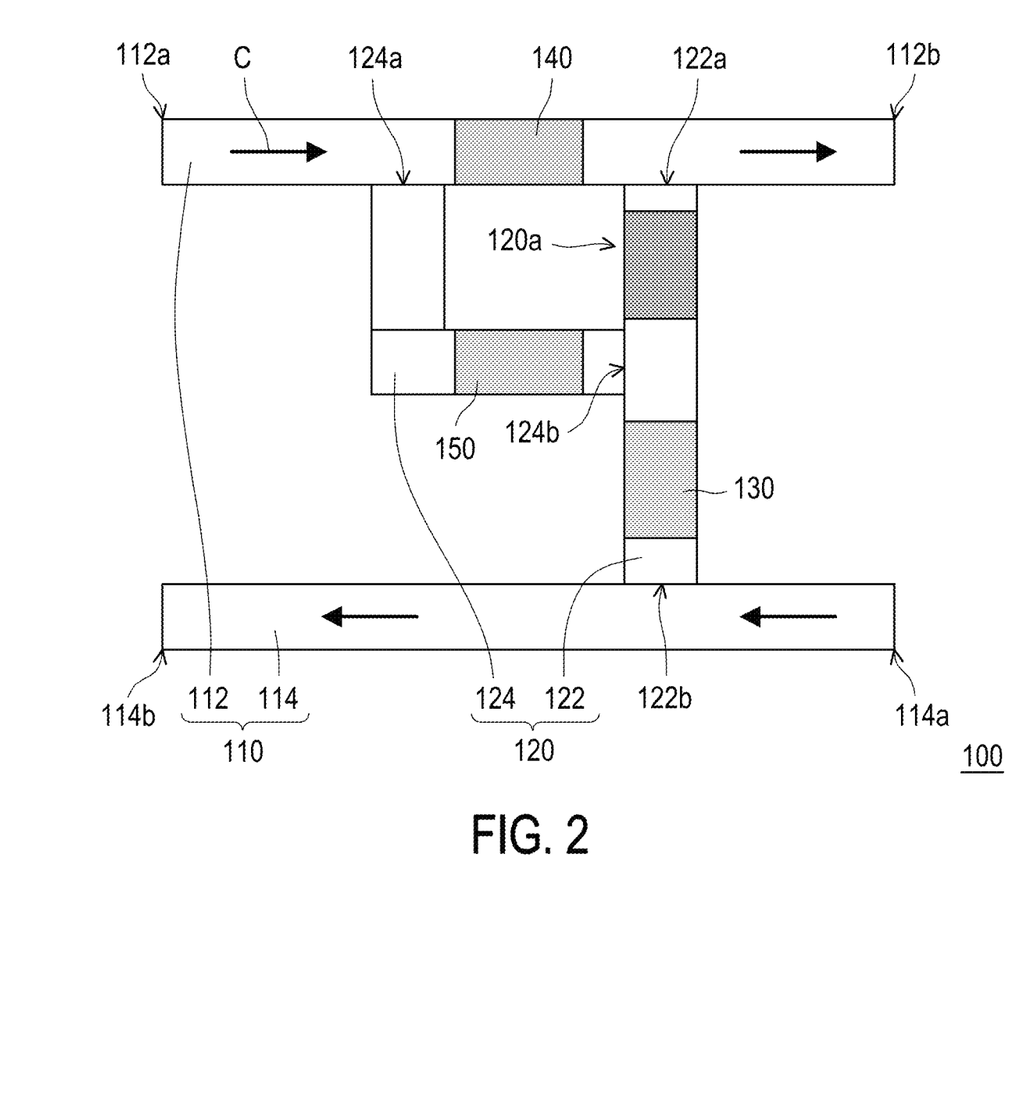
FIG. 2 is a schematic diagram of the flow path module of FIG. 1.

FIG. 1 is a schematic diagram of a flow path module connected between a coolant distribution device and a server according to an embodiment of the disclosure. FIG. 2 is a schematic diagram of the flow path module of FIG. 1. Please refer to FIG. 1 and FIG. 2. The pipeline structure of a flow channel module 100 of the embodiment includes a master pipeline set 110. The master pipeline set 110 is connected between a heat exchange element 52 (for example, a water-cooling plate) of a server 50 and a heat exchange element 62 of a coolant distribution device (that is, a coolant distribution unit, CDU) 60. The heat generated by the heating element of the server 50 is transferred to the heat exchange element 52. A coolant C is adapted to flow through the heat exchange element 52 of the server 50 and the heat exchange element 62 of the coolant distribution device 60 through the master pipeline set 110 and is continuously circulated. The high temperature coolant C is cooled down at the heat exchange element 62 to continuously dissipate heat from the heat exchange element 52 of the server 50. The coolant distribution device 60 controls the heat exchange element 62 to exchange heat and controls a pump 66 to drive the coolant C to flow by, for example, a controller 64 thereof. The specific functions of the coolant distribution device 60 are known in the prior art, so details are not repeated here.

In addition to the existing master pipeline set 110, the pipeline structure of the flow path module 100 of the embodiment further includes a branch pipeline set 120, and the liquid flow path module 100 further includes a first flow resistance element 130. The first flow resistance element 130 is disposed in the branch pipeline set 120, and the flow resistance of the first flow resistance element 130 is adapted to be adjusted corresponding to the flow resistance of the heat exchange element 52.

Specifically, the branch pipeline set 120 is communicated with the master pipeline set 110 and has a monitor section 120a. In the case where the state of the heat exchange element 52 is normal, the flow resistance of the first flow resistance element 130 in the branch pipeline set 120 may be adjusted, so that the flux of the coolant C in the monitor section 120a of the branch pipeline set 120 is a predetermined value (for example, zero). When the flow resistance of the heat exchange element 52 is changed due to the state of the heat exchange element 52 being abnormal (such as leaking or being blocked), the flux of the coolant C in the monitor section 120a of the branch pipeline set 120 correspondingly deviates from the predetermined value (for example, zero), so that a user may know that the state of the heat exchange element 52 is abnormal accordingly. Accordingly, the state of the corresponding heat exchange element 52 may be detected by monitoring the flow path module 100 without the need for a detection circuit that consumes extra power to detect the state of the heat exchange element 52, and the design of a mainboard of the server 50 does not need to be matched with the detection circuit.

The structures of the master pipeline set 110 and the branch pipeline set 120 of the embodiment will be described in detail below. The master pipeline set 110 of the embodiment includes a first master pipeline 112 and a second master pipeline 114, the first master pipeline 112 has a first inlet end 112a and a first outlet end 112b, and the second master pipeline 114 has a second inlet end 114a and a second outlet end 114b. The first outlet end 112b of the first master pipeline 112 and the second inlet end 114a of the second master pipeline 114 are connected to the heat exchange element 52 of the server 50, the first inlet end 112a of the first master pipeline 112 is connected to the heat exchange element 62 of the coolant distribution device 60 through elements such as the pump 66 of the coolant distribution device 60, and the second outlet end 114b of the second master pipeline 114 is connected to the heat exchange element 62 of the coolant distribution device 60. The coolant C enters the first master pipeline 112 from the coolant distribution device 60 through the first inlet end 112a, and reaches the heat exchange element 52 of the server 50 through the first outlet end 112b. After absorbing the heat of the heat exchange element 52, the coolant C enters the second master pipeline 114 through the second inlet end 114a, and reaches the coolant distribution device 60 through the second outlet end 114b. The coolant C is continuously circulated between the server 50 and the coolant distribution device 60 in this way.

Furthermore, the branch pipeline set 120 of the embodiment includes a first branch pipeline 122 and a second branch pipeline 124. The first branch pipeline 122 has a first connecting end 122a and a second connecting end 122b, the first connecting end 122a is connected to the first master pipeline 112 and is located between the first inlet end 112a and the first outlet end 112b, and the second connecting end 122b is connected to the second master pipeline 114 and is located between the second inlet end 114a and the second outlet end 114b. The second branch pipeline 124 has a third connecting end 124a and a fourth connecting end 124b, the third connecting end 124a is connected to the first master pipeline 112 and is located between the first inlet end 112a and the first connecting end 122a, and the fourth connecting end 124b is connected to the first branch pipeline 122 and is located between the first connecting end 122a and the second connecting end 122b. The first flow resistance element 130 is disposed in the first branch pipeline 122 and is located between the fourth connecting end 124b and the second connecting end 122b, and the monitor section 120a is located between the first connecting end 122a and the fourth connecting end 124b. In addition, the flow path module 100 of the embodiment further includes a second flow resistance element 140 and a third flow resistance element 150, which are, for example, fin sets. The second flow resistance element 140 is disposed in the first master pipeline 112 and is located between the first connecting end 122a and the third connecting end 124a, and the third flow resistance element 150 is disposed in the second branch pipeline 124.

The flow resistance of the first flow resistance element 130 is adapted to be adjusted according to the flux of the coolant C, the flow resistance of the second flow resistance element 140, and the flow resistance of the third flow resistance element 150, so that the flux of the coolant C between the first connecting end 122a and the fourth connecting end 124b is the predetermined value (for example, zero), which will be described in detail below.

The relationship between the flux and the pressure difference of the coolant C due to the flow resistance of the pipeline of the flow path module 100 is shown in the following Equations (1) and (2), where $\Delta P$ is the pressure difference of the pipeline, Q is the flux of the pipeline, Z is the flow resistance of the pipeline, and a and b are constants.

$$\Delta P = aQ^2 + bQ \quad (1)$$

$$Q = \Delta P / Z \quad (2)$$

Furthermore, there are a flow resistance Z1 (that is, the flow resistance of the first flow resistance element 130), a flux Q1, and a pressure difference $\Delta P1$ between the second connecting end 122b and the fourth connecting end 124b shown in FIG. 2. There are a flow resistance Z2 (that is, the flow resistance of the second flow resistance element 140), a flux Q2, and a pressure difference $\Delta P2$ between the third connecting end 124a and the first connecting end 122a. There are a flow resistance Z3 (that is, the flow resistance of the third flow resistance element 150), a flux Q3, and a pressure difference $\Delta P3$ between the third connecting end 124a and the fourth connecting end 124b. There are a flow resistance Zg, a flux Qg, and a pressure difference $\Delta Pg$ between the first connecting end 122a and the fourth connecting end 124b. There are a flow resistance Zx, a flux Qx, and a pressure difference $\Delta Px$ between the first connecting end 122*a* and the second connecting end 122*b*. The flow resistance Zx varies with the flow resistance of the heat exchange element 52 of the server 50.

The following Equations (3) to (7) may be obtained from the flow direction of the coolant C in FIG. 2. A flux Qt is the total flux of the coolant C when entering the flow path module 100 or leaving the flow path module 100.

$$Qt=Q2+Q3 \quad (3)$$

$$Qx=Q2+Qg \quad (4)$$

$$Q3=Q1+Qg \quad (5)$$

$$\Delta P2=\Delta P3+\Delta Pg \quad (6)$$

$$\Delta P1=\Delta Px+\Delta Pg \quad (7)$$

According to Equation (1), when the flux Qg is zero (that is, the flux of the coolant C between the first connecting end 122*a* and the fourth connecting end 124*b* is zero), the pressure difference ΔPg is also zero, and bringing the condition into Equations (4) to (7), the following Equations (8) to (11) may be obtained.

$$Qx=Q2 \quad (8)$$

$$Q3=Q1 \quad (9)$$

$$\Delta P2=\Delta P3 \quad (10)$$

$$\Delta P1=\Delta Px \quad (11)$$

Figure 3A:
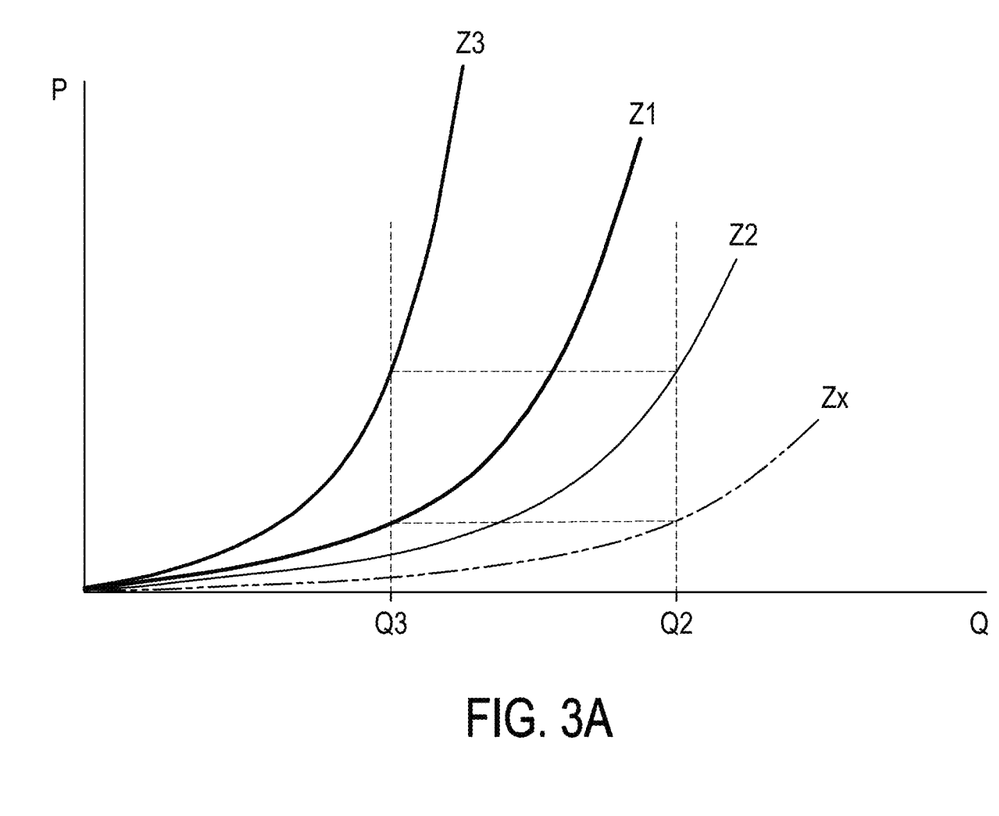
FIG. 3A to FIG. 3C are flow resistance curves of the flow path module of FIG. 2.
Figure 3B:
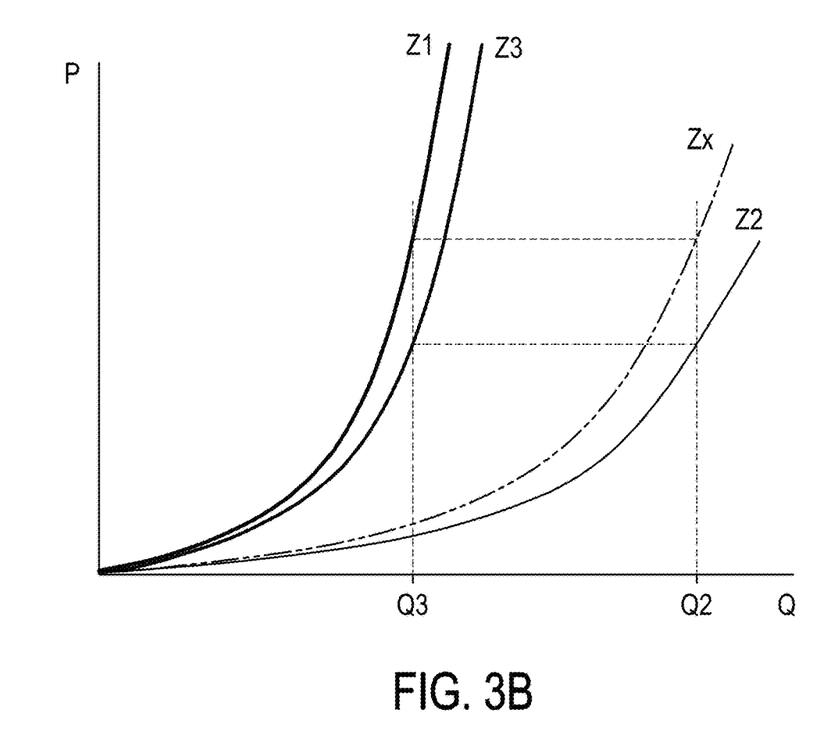
Figure 3C:
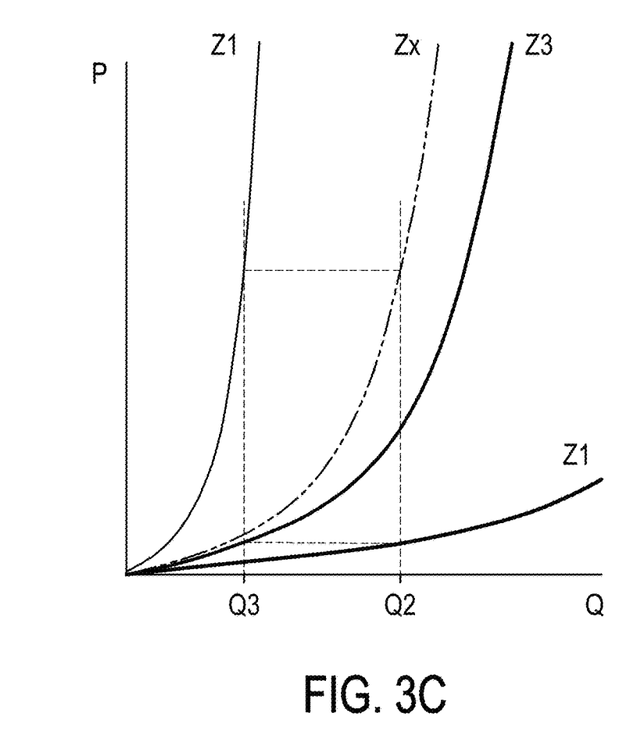

The flux Qt provided by the coolant distribution device 60 is known, and the flow resistance Z2 and the flow resistance Z3 are fixed, so the flux Q2 and the flux Q3 are known. In the case where the flux Qt, the flux Q2, and the flux Q3 are known, a flow resistance value of the first flow resistance element 130 satisfying Equations (4) to (7) must be obtained, so that the flux Qg is zero. The same is exemplified by the flow resistance curves below. FIG. 3A to FIG. 3C are flow resistance curves of the flow path module of FIG. 2. As shown in FIG. 3A, if the flow resistance Z2, the flow resistance Z3, and the flow resistance Zx are known, the flow resistance Z1 may be found to satisfy Equations (4) to (7). The differences between FIG. 3B and FIG. 3A are that the flow resistance Zx of FIG. 3B is closer to the vertical axis, the flow resistance Z2 is correspondingly closer to the vertical axis, the physical meaning may be that the number of fins in the heat exchange element 52 (the water-cooling plate) is greater and the density of the fins is greater, an inner diameter of the pipeline in the heat exchange element 52 (the water-cooling plate) is smaller and the pipeline has more bending, and/or the number of water-cooling plates in series is greater, so that the values of a and b in Equation (1) are greater. The differences between FIG. 3C and FIG. 3B are that the flow resistance Zx of FIG. 3C is closer to the vertical axis, the flow resistance Z2 is correspondingly closer to the vertical axis, the physical meaning may be that the number of fins in the heat exchange element 52 (the water-cooling plate) is greater and the density of the fins is greater, an inner diameter of the pipeline in the heat exchange element 52 (the water-cooling plate) is smaller and the pipeline has more bending, and/or the number of water-cooling plates in series is greater, so that the values of a and b in Equation (1) are greater.

Please refer to FIG. 1. In the embodiment, the first flow resistance element 130 may include a valve body 132. The valve body 132 is movably disposed in the branch pipeline set 120, and the user may drive the valve body 132 to move through a knob 134 and a corresponding screw set 136 to adjust the flow resistance of the first flow resistance element 130. In other embodiments, the first flow resistance element 130 may be an adjustable flow resistance element in other forms, which is not limited in the disclosure.

The flow path module 100 of the embodiment further includes a monitor element 160. The monitor element 160 is disposed in the monitor section 120*a* and is adapted to monitor whether the flux of the coolant C in the monitor section 120*a* is the predetermined value (for example, zero). For example, the monitor element 160 is a turbine shown in FIG. 1. When the flux in the monitor section 120*a* is not zero, the turbine rotates accordingly. The monitor section 120*a* includes a transparent pipeline, and the user may observe whether the turbine rotates through the transparent pipeline, so as to judge whether the flux in the monitor section 120*a* is zero. Further, if the user observes that the coolant C flows from the fourth connecting end 124*b* toward the first connecting end 122*a* in the monitor section 120*a*, the heat exchange element 52 (the water-cooling plate) is judged as leaking and the flow resistance thereof is reduced. On the contrary, if the user observes that the coolant C flows from the first connecting end 122*a* toward the fourth connecting end 124*b* in the monitor section 120*a*, the heat exchange element 52 (the water-cooling plate) is judged as being blocked and the flow resistance thereof is increased. When the above-mentioned abnormalities are judged as occurring in the heat exchange element 52 (the water-cooling plate), the user may replace the heat exchange element 52 (the water-cooling plate) accordingly.

Figure 4:
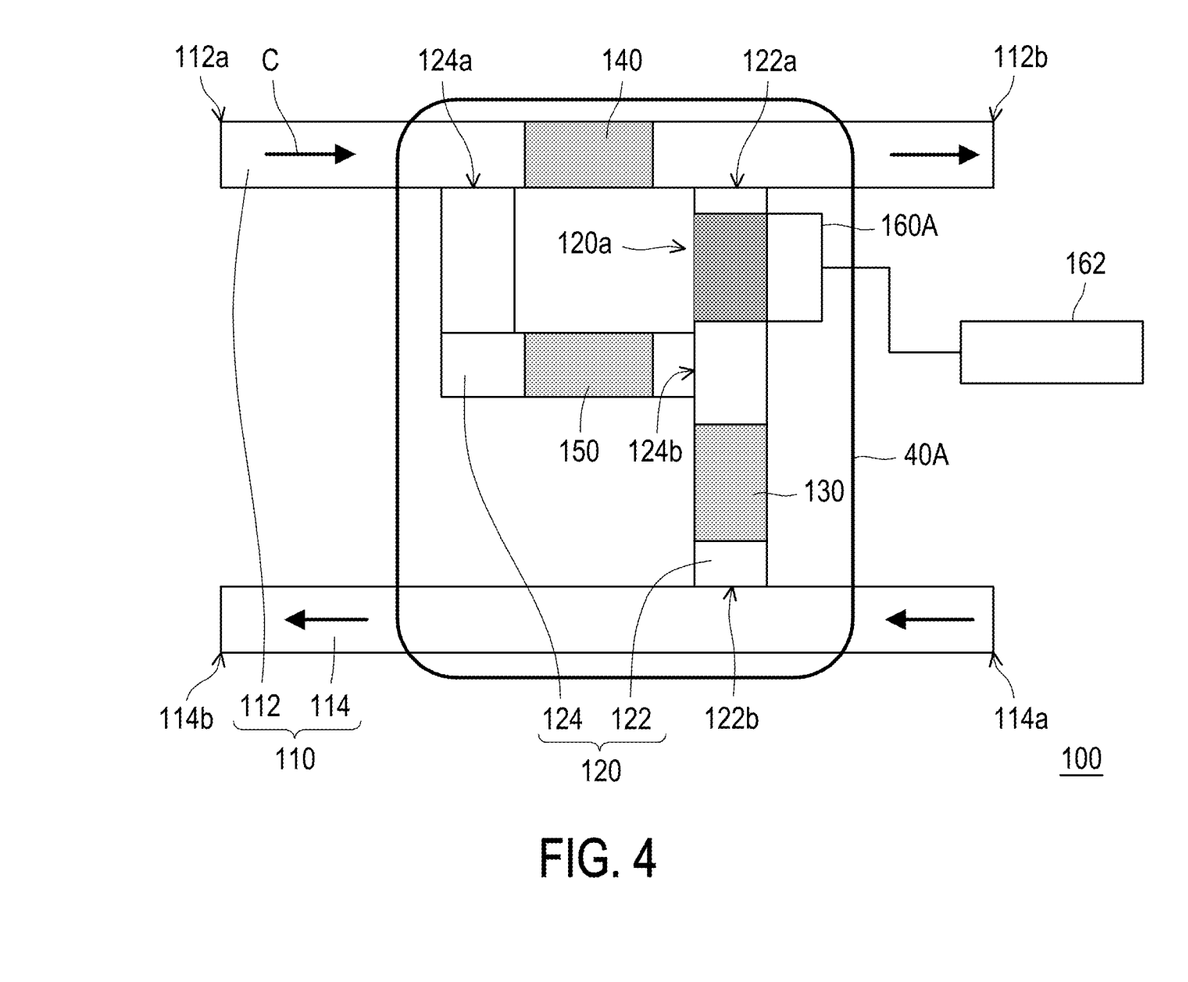
FIG. 4 is a schematic diagram of a flow path module according to another embodiment of the disclosure.

FIG. 4 is a schematic diagram of a flow path module according to another embodiment of the disclosure. The difference between the embodiment shown in FIG. 4 and the embodiment shown in FIG. 1 and FIG. 2 is that a monitor element 160A of the embodiment shown in FIG. 4 is a flow meter or a flux meter, which is connected to a plug-in monitoring system 162. If the monitor element 160A measures that the coolant C flows from the fourth connecting end 124*b* toward the first connecting end 122*a* in the monitor section 120*a*, the heat exchange element 52 (the water-cooling plate) is judged as leaking and the flow resistance thereof is reduced, and a corresponding signal is issued to the monitoring system 162 to let the user know that the heat exchange element 52 (the water-cooling plate) needs to be replaced. On the contrary, if the monitor element 160A measures that the coolant C flows from the first connecting end 122*a* toward the fourth connecting end 124*b* in the monitor section 120*a*, the heat exchange element 52 (the water-cooling plate) is judged as being blocked and the flow resistance is increased, and a corresponding signal is issued to the monitoring system 162 to let the user know that the heat exchange element 52 (the water-cooling plate) needs to be replaced.

Figure 5:
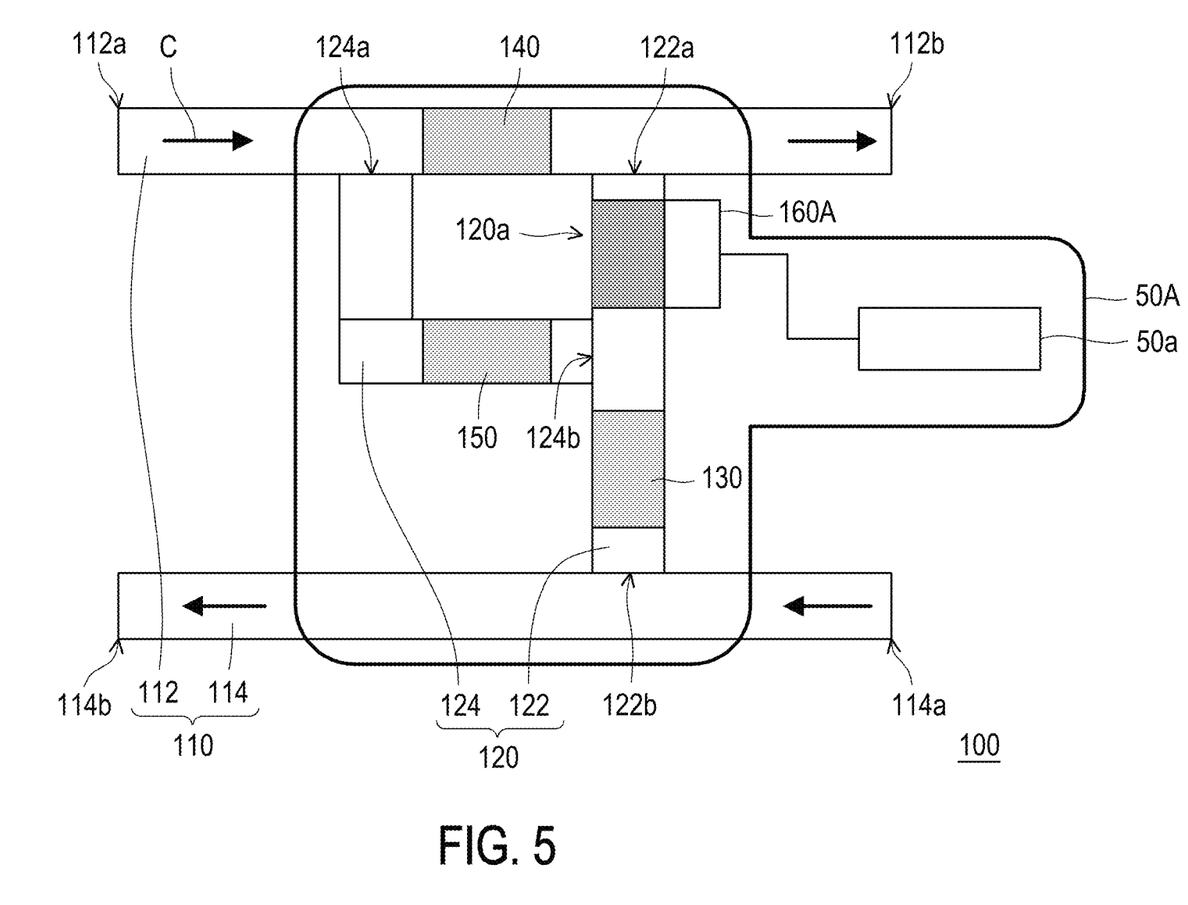
FIG. 5 is a schematic diagram of a server according to another embodiment of the disclosure.

FIG. 5 is a schematic diagram of a server according to another embodiment of the disclosure. The difference between the embodiment shown in FIG. 5 and the embodiment shown in FIG. 4 is that the flow path module 100 of the embodiment shown in FIG. 5 is integrated with a server body 50*a* to form a server 50A including the flow path module 100. Besides, the connection and interaction manners between the flow path module 100 and the server body 50*a* and the coolant distribution device are the same or similar to the connection and interaction manners between the flow path module 100 and the server 50 and the coolant distribution device 60 shown in FIG. 1, FIG. 2, and/or FIG. 4, which will not be repeated here.

Figure 6:
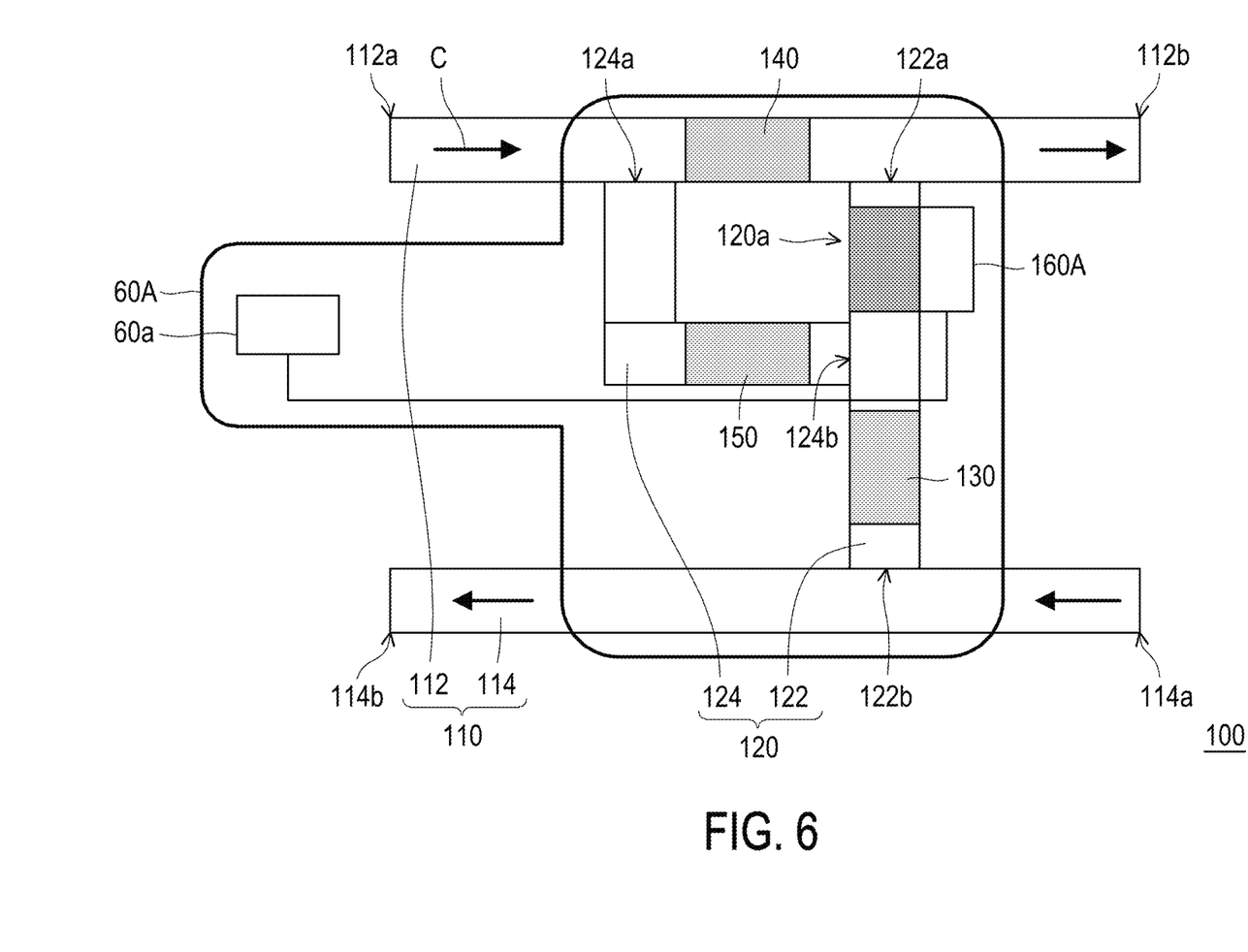
FIG. 6 is a schematic diagram of a coolant distribution device according to another embodiment of the disclosure.

FIG. 6 is a schematic diagram of a coolant distribution device according to another embodiment of the disclosure. The difference between the embodiment shown in FIG. 5 and the embodiment shown in FIG. 4 is that the flow path module 100 of the embodiment shown in FIG. 5 is integrated with a coolant distribution device body 60*a* to form a coolant distribution device 60A including the flow path module 100. Besides, the connection and interaction manners between the flow path module 100 and the server and the coolant distribution device body 60*a* are the same or similar to the connection and interaction manners between the flow path module 100 and the server 50 and the coolant distribution device 60 shown in FIG. 1, FIG. 2, and/or FIG. 4, which will not be repeated here.

What is claimed is:

1. A flow path module with adjustable flow resistance, adapted to a heat exchange element and a coolant, comprising:
    a pipeline structure, adapted to be connected to the heat exchange element; and
    at least one flow resistance element, disposed in the pipeline structure, wherein the coolant flows through the heat exchange element from the pipeline structure, and a flow resistance of the at least one flow resistance element is adapted to be adjusted corresponding to a flow resistance of the heat exchange element.

2. The flow path module with adjustable flow resistance according to claim 1, wherein the pipeline structure comprises a master pipeline set and a branch pipeline set, the at least flow resistance element comprises a first flow resistance element and a valve body, the valve body is movably disposed in the branch pipeline set, the master pipeline set is adapted to be connected to the heat exchange element, the coolant is adapted to pass through the heat exchange element through the master pipeline set, the branch pipeline set is communicated with the master pipeline set and has a monitor section, the first flow resistance element is disposed in the branch pipeline set, a flow resistance of the first flow resistance element is adjusted, so that a flux of the coolant in the monitor section is a predetermined value, and when the flow resistance of the heat exchange element changes, the flux of the coolant in the monitor section deviates from the predetermined value.

3. The flow path module with adjustable flow resistance according to claim 2, wherein the predetermined value is zero.

4. The flow path module with adjustable flow resistance according to claim 2, wherein the master pipeline set comprises a first master pipeline and a second master pipeline, the first master pipeline has a first inlet end and a first outlet end, the second master pipeline has a second inlet end and a second outlet end, the first outlet end and the second inlet end are adapted to be connected to the heat exchange element, and the first inlet end and the second outlet end are adapted to be connected to another heat exchange element.

5. The flow path module with adjustable flow resistance according to claim 4, wherein the heat exchange element is a heat exchange element in a server, and the another heat exchange element is a heat exchange element in a coolant distribution device.

6. The flow path module with adjustable flow resistance according to claim 4, wherein the branch pipeline set comprises a first branch pipeline and a second branch pipeline, the first branch pipeline has a first connecting end and a second connecting end, the first connecting end is connected to the first master pipeline and is located between the first inlet end and the first outlet end, the second connecting end is connected to the second master pipeline and is located between the second inlet end and the second outlet end, the second branch pipeline has a third connecting end and a fourth connecting end, the third connecting end is connected to the first master pipeline and is located between the first inlet end and the first connecting end, the fourth connecting end is connected to the first branch pipeline and is located between the first connecting end and the second connecting end, the first flow resistance element is disposed in the first branch pipeline and is located between the fourth connecting end and the second connecting end, and the monitor section is located between the first connecting end and the fourth connecting end.

7. The flow path module with adjustable flow resistance according to claim 6, wherein the at least flow resistance element further comprises a second flow resistance element and a third flow resistance element, the second flow resistance element is disposed in the first master pipeline and is located between the first connecting end and the third connecting end, the third flow resistance element is disposed in the second branch pipeline, and the flow resistance of the first flow resistance element is adapted to be adjusted according to the flux of the coolant, a flow resistance of the second flow resistance element, and a flow resistance of the third flow resistance element, so that the flux of the coolant between the first connecting end and the fourth connecting end is the predetermined value.

8. The flow path module with adjustable flow resistance according to claim 2, further comprising a monitor element, wherein the monitor element is disposed in the monitor section, and the monitor element is adapted to monitor whether the flux of the coolant in the monitor section is the predetermined value.

9. The flow path module with adjustable flow resistance according to claim 8, wherein the monitor element comprises a turbine, a flow meter, or a flux meter.

10. The flow path module with adjustable flow resistance according to claim 2, wherein the monitor section comprises a transparent pipeline.

11. A coolant distribution device, adapted to a heat exchange element and a coolant, comprising:
    a device body; and
    a flow path module with adjustable flow resistance, comprising:
        a pipeline structure, adapted to be connected between the heat exchange element and the device body; and
        at least one flow resistance element, disposed in the pipeline structure, wherein the coolant flows through the heat exchange element from the pipeline structure, and a flow resistance of the at least flow resistance element is adapted to be adjusted corresponding to a flow resistance of the heat exchange element.

12. The coolant distribution device according to claim 11, wherein the pipeline structure comprises a master pipeline set and a branch pipeline set, the at least flow resistance element comprises a first flow resistance element and a valve body, the valve body is movably disposed in the branch pipeline set, the master pipeline set is adapted to be connected to the heat exchange element, the coolant is adapted to pass through the heat exchange element through the master pipeline set, the branch pipeline set is communicated with the master pipeline set and has a monitor section, the first flow resistance element is disposed in the branch pipeline set, a flow resistance of the first flow resistance element is adjusted, so that a flux of the coolant in the monitor section is a predetermined value, and when the flow resistance of the heat exchange element changes, the flux of the coolant in the monitor section deviates from the predetermined value.

13. The coolant distribution device according to claim 12, wherein the predetermined value is zero.

14. The coolant distribution device according to claim 12, wherein the master pipeline set comprises a first master pipeline and a second master pipeline, the first master pipeline has a first inlet end and a first outlet end, the second master pipeline has a second inlet end and a second outlet end, the first outlet end and the second inlet end are adapted to be connected to the heat exchange element, the coolant distribution device comprises another heat exchange element, the another heat exchange element is disposed in the device body, and the first inlet end and the second outlet end are adapted to be connected to the another heat exchange element.

15. The coolant distribution device according to claim 14, wherein the branch pipeline set comprises a first branch pipeline and a second branch pipeline, the first branch pipeline has a first connecting end and a second connecting end, the first connecting end is connected to the first master pipeline and is located between the first inlet end and the first outlet end, the second connecting end is connected to the second master pipeline and is located between the second inlet end and the second outlet end, the second branch pipeline has a third connecting end and a fourth connecting end, the third connecting end is connected to the first master pipeline and is located between the first inlet end and the first connecting end, the fourth connecting end is connected to the first branch pipeline and is located between the first connecting end and the second connecting end, the first flow resistance element is disposed in the first branch pipeline and is located between the fourth connecting end and the second connecting end, and the monitor section is located between the first connecting end and the fourth connecting end.

16. The coolant distribution device according to claim 15, wherein the at least flow resistance element further comprises a second flow resistance element and a third flow resistance element, the second flow resistance element is disposed in the first master pipeline and is located between the first connecting end and the third connecting end, the third flow resistance element is disposed in the second branch pipeline, and the flow resistance of the first flow resistance element is adapted to be adjusted according to the flux of the coolant, a flow resistance of the second flow resistance element, and a flow resistance of the third flow resistance element, so that the flux of the coolant between the first connecting end and the fourth connecting end is the predetermined value.

17. The coolant distribution device according to claim 12, wherein the heat exchange element is a heat exchange element in a server.

18. The coolant distribution device according to claim 12, wherein the flow path module with adjustable flow resistance further comprises a monitor element, the monitor element is disposed in the monitor section, and the monitor element is adapted to monitor whether the flux of the coolant in the monitor section is the predetermined value.

19. The coolant distribution device according to claim 18, wherein the monitor element comprises a turbine, a flow meter, or a flux meter.

20. The coolant distribution device according to claim 12, wherein the monitor section comprises a transparent pipeline.

21. A server, adapted to a coolant, comprising:
a server body;
a heat exchange element, disposed in the server body; and
a flow path module with adjustable flow resistance, comprising:
    a pipeline structure, connected to the heat exchange element; and
    at least one flow resistance element, disposed in the pipeline structure, wherein the coolant flows through the heat exchange element from the pipeline structure, and a flow resistance of the at least flow resistance element is adapted to be adjusted corresponding to a flow resistance of the heat exchange element.

* * * * *